United States Patent [19]
Wakimoto

[11] Patent Number: 4,815,111
[45] Date of Patent: Mar. 21, 1989

[54] DATA RECEIVING SYSTEM
[75] Inventor: Akihiko Wakimoto, Hyogo, Japan
[73] Assignee: Mitsubishi Denki Kabushiki Kaisha, Tokyo, Japan
[21] Appl. No.: 917,589
[22] Filed: Oct. 10, 1986
[30] Foreign Application Priority Data Oct. 11, 1985 [JP] Japan .................. 60-227190

[51] Int. Cl.$^4$ .................. H04L 7/00; G11C 19/00
[52] U.S. Cl. .................. 375/114; 375/116; 377/75
[58] Field of Search ........... 375/118, 114, 116, 106; 380/48; 377/75, 114

[56] References Cited

U.S. PATENT DOCUMENTS

| 3,243,728 | 3/1966 | Brainerd et al. | 377/126 X |
| 4,002,834 | 1/1977 | Cocci et al. | 375/106 |
| 4,027,175 | 5/1977 | Hurst | 377/114 X |
| 4,284,953 | 8/1981 | Hepworth et al. | 377/75 |
| 4,353,130 | 10/1982 | Carasso et al. | 375/114 |
| 4,368,531 | 1/1983 | Chopping | 375/118 |
| 4,481,575 | 11/1984 | Bazlen et al. | 364/200 |
| 4,517,681 | 5/1985 | Mantellina et al. | 375/106 |

FOREIGN PATENT DOCUMENTS 2032116 of 0000 Fed. Rep. of Germany.

Primary Examiner—Stephen C. Buczinski
Assistant Examiner—Linda J. Wallace
Attorney, Agent, or Firm—Sughrue, Mion, Zinn, Macpeak & Seas

[57] ABSTRACT

A serial data input shift register in which an additional register receives the output of the serial shift register. The bits of both registers are initialized to one value except for the input location of the shift register which is initialized to a second value. When the second value reaches the additional register, the shift register has been filled.

3 Claims, 2 Drawing Sheets

DATA RECEIVING SYSTEM

BACKGROUND OF THE INVENTION

1. Field of the Invention

This invention relates to a serial data receiving system, for instance, in an integrated circuit.

2. Background Art

A conventional receiver of this type is as shown in FIG. 1. In FIG. 1 is shown a receive register 1 and a counter 2. Numerals above the blocks of the register 1 designate respective digits. Upon the start of the receiving operation, n-bits of serial data D are received, and inputted into the receiver register 1 and shifted one bit at a time in synchronization with a receive clock pulse T. On the other hand, the receive clock pulse T is counted by the counter 2. That is, the number of received data (or the number of bits) is counted. When the counter 2 has counted the number (n) of received data, the counter 2 outputs a completion signal C to inform the receive register 1 of the fact that n-bits of received data D have been provided to the receive register 1.

The conventional receiver thus constructed needs the counter for counting the receive clock pulse T in order to count the number of received data. Therefore, the number of circuits in the integrated circuit is relatively large. As a result, these circuits occupy a relatively larger part of the area of the integrated circuit.

Accordingly, an object of this invention is to eliminate the above-described difficulties. More specifically, an object of the invention is to provide a serial data receiving system which permits the elimination of the counter which counts the receive clock pulse T. This elimination thereby simplifies the circuitry.

SUMMARY OF THE INVENTION

In a data receiving system according to this invention, a 1-bit register is added to an original register for receiving data and the contents of these two registers are initialized before the data receiving operation is started.

Whenever received data are received by the original register, the contents of the original register which have been initialized are shifted successively and outputted from the additional register. When n bits of the received data have been provided to the original register, the initialized data is provided at the most significant bit, or the $(n-1)$th bit. Therefore, the completion of the data receiving operation can be detected by providing a unique data value only at the $(n-1)$th bit.

The parts (a) through (e) of FIG. 3 are explanatory diagrams for a description of the operation of the data receiving system.

DETAILED DESCRIPTION OF THE PREFERRED EMBODIMENTS

A data receiving system, which is one embodiment of this invention, will be described with reference to the accompanying drawings.

Figure 1:
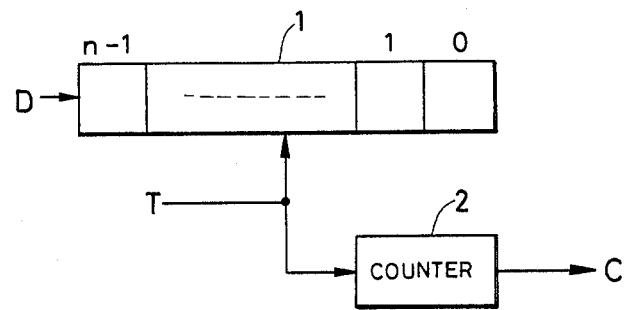
FIG. 1 is a block diagram showing a conventional data receiving system.
Figure 2:
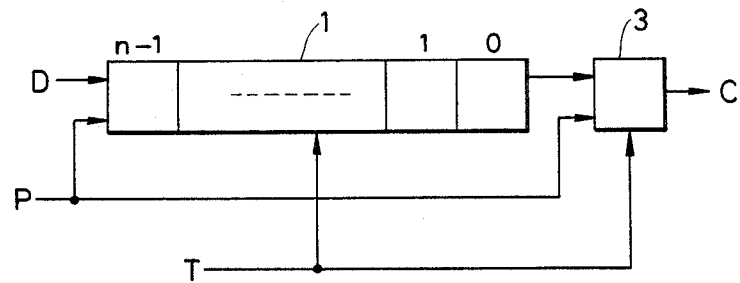
FIG. 2 is a block diagram showing the arrangement of a data receiving system which is one embodiment of the invention.
Figure 3A:
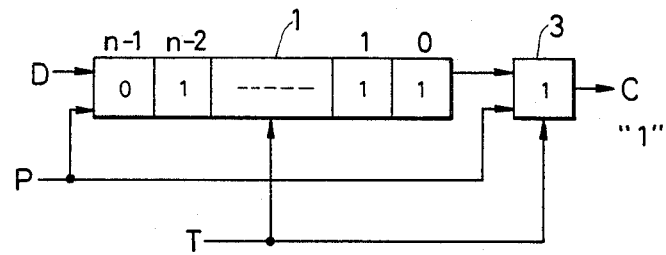
Figure 3B:
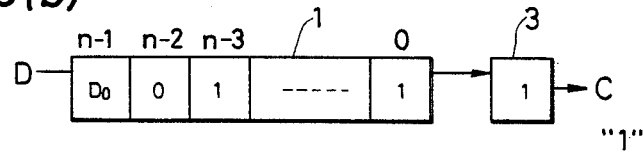
Figure 3C:
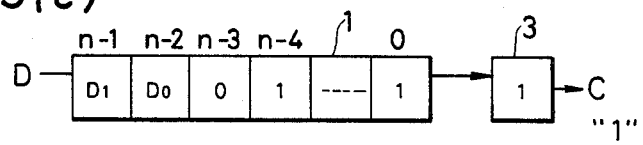
Figure 3D:
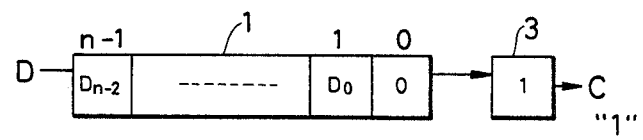
Figure 3E:
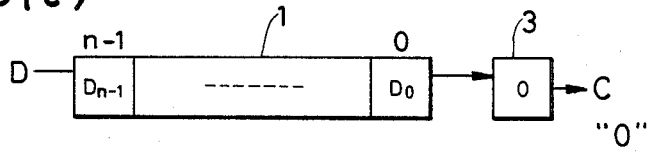

In FIG. 2, a receive (main) register 1 is similar to that which has been described with reference to FIG. 1. An additional 1-bit register 3 changes its output signal simultaneously when the data reception has been accomplished. The input of the additional register is connected to the output of the main register 1. The additional register 3 is to receive the data which is shifted in the receive register 1 in synchronization with a receive clock pulse T, and the additional register 3 provides the data thus received as its output. The output thus provided is a data reception completion signal C.

A data reception start signal P is applied to the receive register 1 and the additional register 3 so that the contents of the two registers 1 and 3 are initialized immediately before the signal reception is started. The initialization can be accomplished by transferring the contents of parallel registers holding the initialization values to the register 1 and 3.

In the system thus organized, upon start of the data receiving operation, the data reception start signal P is applied to the two registers 1 and 3 to initialize the contents of the two registers 1 and 3. The contents of the initialization is as follows: For instance in the case where the number of received data is n (bits) as shown in the part (a) of FIG. 2, only the $(n-1)$th bit in the receive register is set to "0", and the remaining bits in the receive register 1 and the content of the additional register 3 are set to "1".

Under this initialization condition, received data D are inputted into the receive register 1 one bit by one bit in synchronization with the receive clock pulse T. In this operation, whenever a bit $D_i$ is received by the receive register 1, the content of the receive register 1 is outputted from the additional register 3 while being shifted one bit at a time. That is, the "1" bits initially set at the bits other than the $(n-1)$th bit are successively outputted until the signal reception is accomplished, i.e., until the bit "0" at the $(n-1)$th bit is shifted to the 0-th bit, as shown in the parts (b) through (d) of FIG. 3. In the next cycle, when n received data bits $D_0-D_{n-1}$ are input into the receive register 1 as shown in the part (e) of FIG. 3, the "0" bit originally set at the $(n-1)$th bit is shifted into the additional register 3, whereupon the output of the additional register 3 is changed from "1" to "0" for the first time. If this change is employed as the data reception completion signal, then the accomplishment of the data reception can be detected.

In the above-described embodiment, the content of the receive register 1 is so initialized that only the bit at the $(n-1)$th bit is set to "0" and the remaining bits in the receive register 1 and the content of the additional register 3 are set to "1". However, the same effect can be obtained by setting only the bit at the $(n-1)$th location to "1" and setting the remaining bits in the receive register and the content of the additional register 3 to "0". The primary difference is that the polarity of the signal reception completion signal is changed.

As was described above, according to the invention, the 1-bit register is added to the receive register, and contents of these two registers are initialized at the start of the signal reception, so that the data reception completion signal is outputted. Therefore, in the data receiving system of the invention, it is unnecessary to use the counter for counting the receive clock pulse which is employed in the conventional data receiving system. Therefore, the chip area of the integrated circuit can be commensurately reduced, with a result that a receiver simple in construction can be built.

What is claimed is:

1. A serial data receiving system for n-bit data, comprising:
   an n-bit shift register receiving arbitrary input data at a location on one end in synchronism with a clock signal;
   a 1-bit register receiving an output from another end of said n-bit shift register in synchronism with said clock signal;
   means for initializing, prior to said receiving of said input data and prior to an operation of said clock signal, said location on said one end of said n-bit shift register to a first value and for initializing said 1-bit register and locations of said n-bit register other than said location on said one end to a second value different from said first value, whereby a content of said 1-bit register being said first value is a data reception completion signal which indicates that n-bits of data have been input, said initializing means being independent of outputs of said n-bit and 1-bit shift registers.

2. A serial data receiving system as recited in claim 1, wherein said 1-bit register includes an output having a value equal to its content.

3. A serial data receiving system as recited in claim 1, wherein said clock signal enables said receiving of said input data after a completion of an operation of said initializing means.

* * * * *